US006686237B1

(12) United States Patent
Wofford et al.

(10) Patent No.: US 6,686,237 B1
(45) Date of Patent: Feb. 3, 2004

(54) HIGH PRECISION INTEGRATED CIRCUIT CAPACITORS

(75) Inventors: Bill Alan Wofford, Dallas, TX (US); Robert Nguyen, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/286,936

(22) Filed: Oct. 31, 2002

(51) Int. Cl.[7] .......................................... H01L 21/8242
(52) U.S. Cl. ........................ 438/239; 438/253; 438/396; 438/704; 438/711; 438/734; 438/745
(58) Field of Search ................................. 438/239, 250, 438/253, 254, 396, 397, 704, 706, 711, 734, 745, 749, 751

(56) References Cited

U.S. PATENT DOCUMENTS 6,399,515 B1 * 6/2002 Tao et al. .................... 438/734

* cited by examiner

*Primary Examiner*—Jack Chen
(74) *Attorney, Agent, or Firm*—Peter K. McLarty; W. James Brady, III; Frederick J. Telecky, Jr.

(57) ABSTRACT

A polysilicon layer (30) is formed on a dielectric region (20). An optional metal silicide layer (50) can be formed on the polysilicon layer. A dielectric layer (60) is formed over the metal silicide layer and a conductive layer (70) formed over the dielectric layer. The formed layers are etched by a combination of multi-step dry and wet process to form high precision integrated circuit capacitors.

7 Claims, 2 Drawing Sheets

US 6,686,237 B1

HIGH PRECISION INTEGRATED CIRCUIT CAPACITORS

FIELD OF THE INVENTION

The present invention relates to a method for forming high precision integrated circuit capacitors using polysilicon and titanium nitride electrodes.

BACKGROUND OF THE INVENTION

High precision analog integrated circuits often require integrated circuit capacitors. Analog-to-digital and digital-to-analog converters require a number of precision capacitors for proper operation. For example in a true eighteen bit converter some of the capacitor requirements are a ratio stability of less than 0.00075% over 10 years, a voltage coefficient of less than 10 ppm/V, a temperature drift match of less than 0.05%/° C. dielectric absorption of less than 0.00075%, capacitance greater than 0.5 $fF/\mu m^2$.

A crucial limitation in manufacturing high precision integrated circuit capacitors is the formation of the capacitor plates. Integrated circuit capacitors are formed by placing a thin dielectric layer between two conductive plates. In most instances the dielectric layer will comprise silicon oxide and the conductive plates can be formed using any conductive material present in the integrated circuit such as doped polycrystalline silicon and/or metals. In manufacturing the capacitor the conductive plates are formed by etching a conductive layer to the desired shape. Current etch techniques limit the precision of the capacitors so formed by producing nonlinear etch profiles, by leaving filaments of the material being etched, by trenching the surface of the integrated circuit, and by damaging the capacitor dielectric layer at the edge of the capacitor. There is therefore a need for a method to form high precision integrated circuit capacitors that is not limited by present etching constraints.

SUMMARY OF INVENTION

The instant invention describes a method for forming an integrated circuit capacitor. The method comprises forming a dielectric region in a semiconductor substrate and forming a patterned polysilicon layer on the dielectric region. An optional metal silicide layer can be formed on the polysilicon layer and a second dielectric layer formed over the polysilicon layer or metal silicide layer if one was formed. A conductive layer is formed over the dielectric layer and a hardmask layer is formed over the conductive layer.

In forming the capacitor structure the hardmask layer is etched and the conductive layer partially etched using a tow step dry etch process and the remaining conductive layer is etched using a wet etch process. In an embodiment of the method the first plasma etch step is a plasma etch process comprising $Cl_2$, Ar, and $BCl_3$ and the second plasma etch step is a plasma etch process comprising $Cl_2$, Ar, $BCl_3$, and $N_2$. The wet etch process is a two-step process where the first wet etch step comprises spraying a Piranha solution and a SC1 solution and the second wet etch step comprises a SC1 megasonic process.

In a further embodiment of the invention a three-step dry plasma etch process is used to etch all the layers to form the capacitor.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1A:
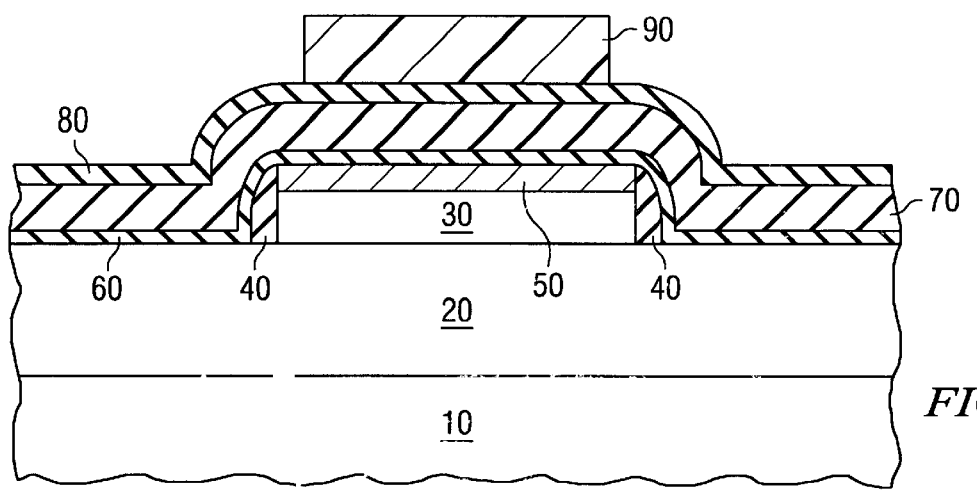
FIGS. 1(a)–(d) are cross-sectional diagrams showing an embodiment of the instant invention.

Referring to FIG. 1(a), isolation structures 20 are formed on a semiconductor substrate 10. The isolation structures can comprise silicon oxide, silicon oxynitride, silicon nitride, or any suitable insulating dielectric material. In the embodiment shown in FIG. 1(a), the isolation structure is a localized oxidation structure (LOCOS). In addition to the LOCOS structure, the isolation structure 20 shown in FIG. 1(a) could also comprise a shallow trench isolation (STI) structure. Finally in a further embodiment of the instant invention the isolation structure 20 shown in FIG. 1(a) could comprise a dielectric layer comprising silicon oxide formed on the surface of the semiconductor substrate (10). A patterned polycrystalline silicon (polysilicon) structure 30 is formed on the isolation structure 20. In forming the patterned polysilicon structure, a blanket layer of polysilicon is formed over the semiconductor substrate 10 which is patterned and etched to form the patterned polysilicon structure 30. The patterned polysilicon structure 30 is doped either n-type or p-type and optional sidewall structures 40 are formed adjacent to the sides of the polysilicon structure 30. The sidewall structures 40 comprise an insulator dielectric material and is often formed using silicon oxide or silicon nitride. Following the formation of the sidewall structures 40, a silicide layer 50 is formed in the polysilicon structure 30. The silicide layer 50 can be formed using cobalt, titanium, tungsten, or any other suitable metal. The combined structure of the patterned polysilicon structure 30 and the silicide layer 50 will form a plate of the integrated circuit capacitor. The size and profile of the polysilicon structure can be precisely controlled using photolithography and polysilicon etching techniques. Following the formation of the silicide layer 50 and any other necessary processing steps, a dielectric layer 60 is formed over the silicide layer 50 and the sidewall structures 40. The dielectric layer 60 will function as the capacitor dielectric. In an embodiment of the instant invention the dielectric layer 60 comprises a 300 to 700 angstrom low pressure TEOS (LPTEOS) silicon oxide layer. The dielectric layer 60 is not limited however to LPTEOS silicon oxide and other dielectric material such as silicon oxide formed using other methods such as chemical vapor deposition, silicon nitride, silicon oxynitride, silicates, or varying layers of different dielectric materials can be used to form the dielectric layer 60. Following the formation of the dielectric layer 60, an electrically conductive layer 70 is formed over the dielectric layer 60. The conductive layer 70 will be used to form the second plate of the capacitor. In an embodiment of the instant invention titanium nitride (TiN) can be used to form the conductive layer 70. The TiN layer can be about 2000 angstroms thick and can be formed by sputtering titanium unto the dielectric layer 60 through a nitrogen ambient with the substrate 10 (and therefore the dielectric layer 70) heated to between 3500° C. and 5500° C. In addition to titanium nitride other any other suitable conductive material can be used to form the layer 70 include tungsten, titanium-tungsten, and metals such as aluminum. A hard mask layer 80 is formed over the conductive layer 70 and a patterned photoresist layer 90 is formed over the hardmask layer 80. The hardmask layer can comprise about 500 angstroms of silicon oxide. In addition to silicon oxide, silicon nitride, and silicon oxynitride can also be used to form the hardmask layer 80.

Figure 1B:
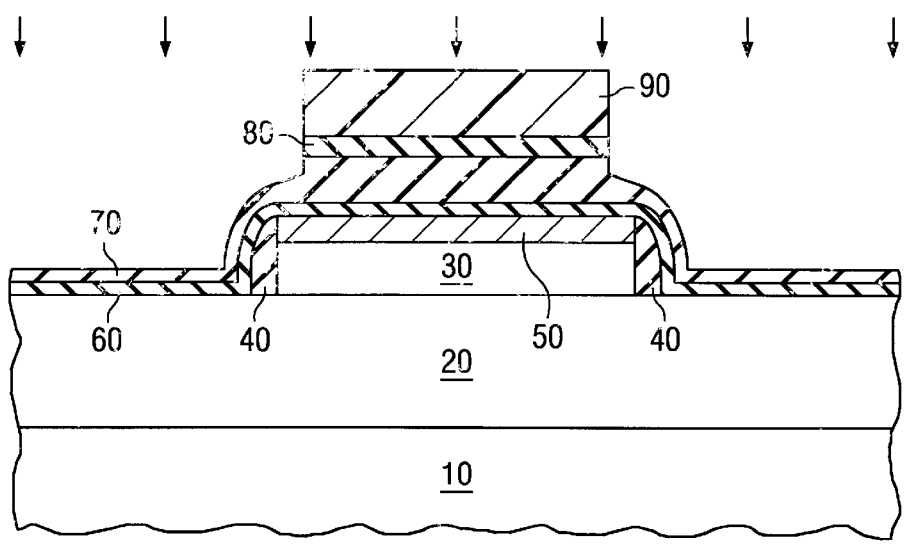

As shown in FIG. 1(b), a dry plasma etching process is first used to etch the hardmask layer 80 and partially etch the conductive layer 70. For the embodiment where silicon oxide is used to form the hardmask layer and TiN is used to form the conductive layer 70 the following two-step plasma etch process is used.

| Parameter | Step 1 | Step 2 |
|---|---|---|
| Pressure (mtorr) | 8 | 8 |
| Time (sec) | 30 | 40 |
| Bias RF Power (W) | 180 | 100 |
| Source RF Power (W) | 1000 | 1000 |
| He Cooling Pressure (torr) | 10 | 10 |
| $Cl_2$ flow (sccm) | 30 | 50 |
| Ar flow (sccm) | 60 | 55 |
| $BCl_3$ flow (sccm) | 45 | 15 |
| $N_2$ flow (sccm) | 0 | 10 |

The etch processes can be performed in a plasma etch chamber capable of supplying the required RF power levels and gas flows. The parameters of the etch processes shown above can be varied by ±20% without affecting the etch properties. The first step of the plasma etch process removes the exposed or unmasked region of the silicon oxide hardmask layer 80 without substantially attacking the underlying TiN layer 70. The second step of the etch process removes the exposed regions of the TiN layer 70. This is a timed etch designed to remove about half of the initial TiN layer thickness without etching the underlying dielectric layer. As such the time that the layer 70 is subjected to the etch will depend on the initial thickness of the layer 70.

Figure 1C:
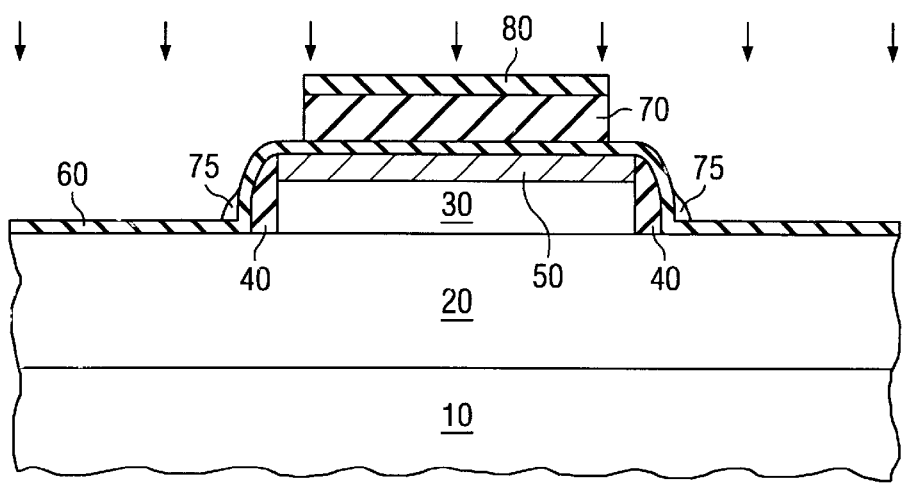

Following the dry etch process the patterned photoresist layer 90 is removed and the remaining TiN layer is removed using a two-step wet etch process as show in FIG. 1(c). In the first step of the wet etch process the remaining TiN layer is removed using a directional process comprising a Piranha solution of $H_2SO_4$ and $H_2O_2$ in a 7 to 1 ratio and a SC1 solution of $H_2O_2$, $H_2SO_4$, and de-ionized water in a 1 to 1 to 5 ratio which are both sprayed in a perpendicular manner unto the structure as shown in FIG. 1(c). Following the directional wet etch process it is possible to have TiN filaments 75 remaining on the structure as shown in FIG. 1(c). The filaments 75 are removed using a SC1 etch process that can optionally be performed in a megasonic bath. The agitation provided by the megasonic bath helps to break the filaments away from the structure. During the directional wet etch process the remaining hardmask layer 80 (in FIG. 1(c)) protects the TiN and helps to produce a TiN capacitor plate with a well defined edge profile. This allows high precision integrated circuit capacitors to be reliably and repeatedly formed.

Figure 1D:
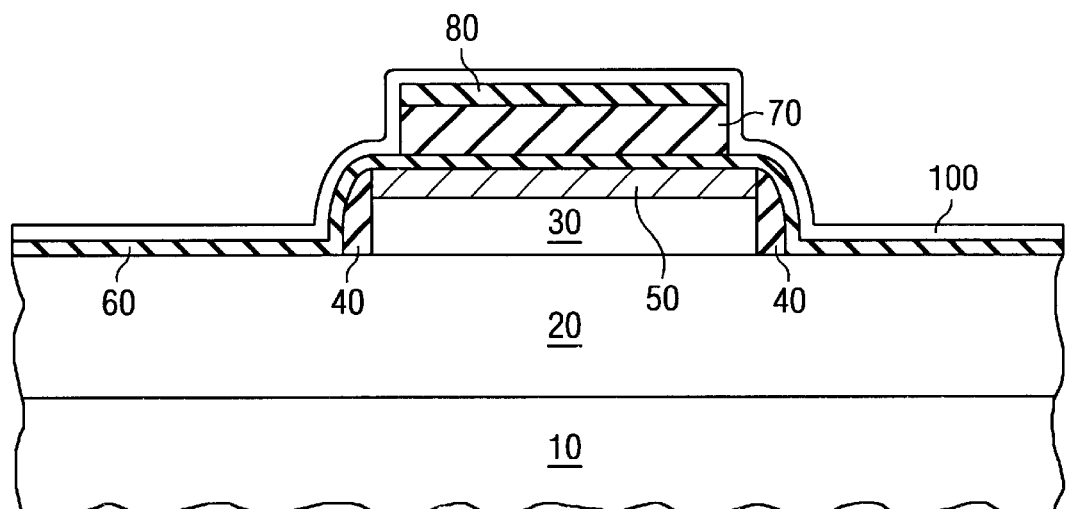

Following the etch processes a capping dielectric layer 100 can be formed over the capacitor structure. In FIG. 1(d), the remaining conductive layer 70 and the silicide 50/polysilicon layer 30 will function as the capacitor plates while the region of the dielectric layer 60 positioned between the remaining conductive layer 70 and the silicide 50/polysilicon layer 30 functions as the capacitor dielectric.

In a further embodiment, a silicon oxide hardmask layer 80 and a TiN layer 70 in FIG. 1(a) is completely etched by a three-step dry etch process shown below.

| Parameter | Step 1 | Step 2 | Step 3 |
|---|---|---|---|
| Pressure (mTorr) | 8 | 8 | 15 |
| Time (sec) | 30 | 40 | 70 |
| Bias RF Power (W) | 180 | 100 | 25 |
| Source RF Power (W) | 1000 | 1000 | 800 |
| He Cooling Pressure (torr) | 10 | 10 | 10 |
| $Cl_2$ flow (sccm) | 30 | 50 | 90 |
| Ar flow | 60 | 55 | 10 |
| $BCl_3$ flow (sccm) | 45 | 15 | 0 |
| $N_2$ flow (sccm) | 0 | 10 | 0 |

The etch processes can be performed in a plasma etch chamber capable of supplying the required RF power levels and gas flows. In step 1 the exposed regions of the silicon oxide hardmask layer 80 are removed. Step 2 removes the exposed regions of the TiN conductive layer 70. This is a timed etch and is set to remove most of the exposed layer. The third step is a TiN over-etch process which is more selective to silicon oxide than the previous step and will remove the remaining exposed TiN from the structure without substantially etching the other exposed layers. The parameters of the three step etch process can be varied by ±10% without affecting the properties of the etch process.

Figure 2:
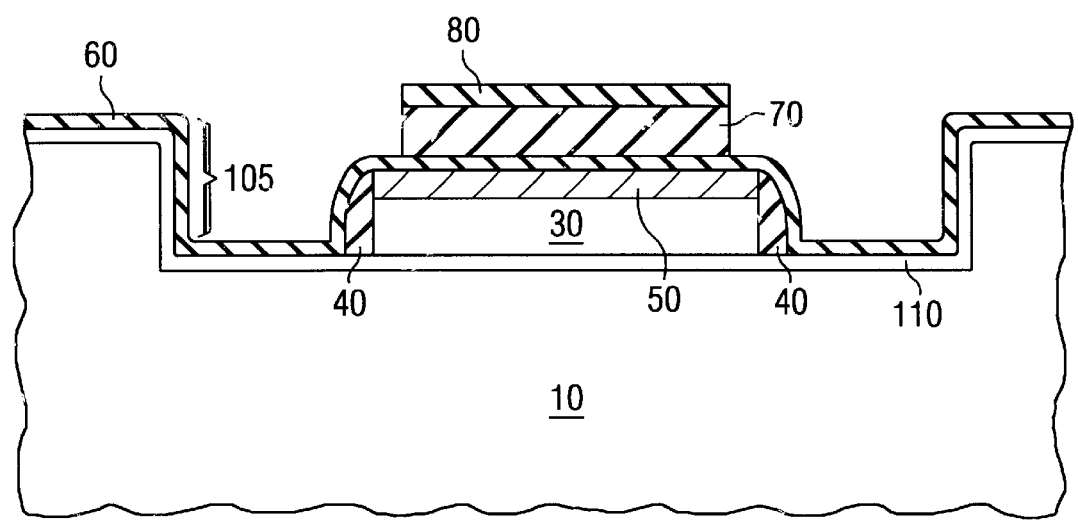
FIG. 2 is a cross-sectional diagram showing a further embodiment of the instant invention.

A further embodiment of the instant invention is shown in FIG. 2. In this embodiment a trench 105 is first formed in the silicon substrate using known processing techniques. The integrated circuit capacitor structure is then formed in the trench. The capacitor structure is formed on a dielectric layer 110 that is formed on the surface of the substrate in the trench. The capacitor structure is formed using the methodology of the instant invention described above.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for forming an integrated circuit capacitor, comprising:
    forming a dielectric region over a semiconductor substrate;
    forming a patterned polysilicon layer on said dielectric region;
    forming a dielectric layer over said polysilicon layer;
    forming a conductive layer over said dielectric layer;
    forming a hardmask layer over said conductive layer;
    etching said hardmask layer and partially etching said conductive layer using a dry etch process; and
    etching remaining conductive layer using a wet etch process.

2. The method of claim 1 wherein said dry etch process used to etch said hardmask layer and partially etch said conductive layer is a two step etch process consisting essentially of a first plasma etch step and a second plasma etch step.

3. The method of claim 2 wherein said first plasma etch step is a plasma etch process comprising $Cl_2$, Ar, and $BCl_3$.

4. The method of claim 3 wherein said second plasma etch step is a plasma etch process comprising $Cl_2$, Ar, $BCl_3$, and $N_2$.

5. The method of claim 1 wherein said wet etch process is a two step etch process consisting essentially of a first wet etch step and a second wet etch step.

6. The method of claim 5 wherein said first wet etch step comprises spraying a Piranha solution and a SC1 solution.

7. The method of claim 6 wherein said second wet etch step comprises a SC1 megasonic process.

* * * * *